(12) United States Patent
Yang (10) Patent No.: US 12,300,354 B2
(45) Date of Patent: *May 13, 2025

(54) WORDLINE DRIVER CIRCUIT AND MEMORY

(71) Applicant: CHANGXIN MEMORY TECHNOLOGIES, INC., Hefei (CN)

(72) Inventor: Guifen Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 406 days.

This patent is subject to a terminal disclaimer.

(21) Appl. No.: 17/846,031

(22) Filed: Jun. 22, 2022

(65) Prior Publication Data
US 2023/0036354 A1    Feb. 2, 2023

Related U.S. Application Data

(63) Continuation of application No. PCT/CN2021/117277, filed on Sep. 8, 2021.

(30) Foreign Application Priority Data

Jul. 29, 2021  (CN) .......................... 202110864906.8

(51) Int. Cl.
G11C 8/14   (2006.01)
G11C 8/08   (2006.01)

(52) U.S. Cl.
CPC ...................................... G11C 8/08 (2013.01)

(58) Field of Classification Search
CPC .............. G11C 8/08; G11C 8/14; G11C 5/025
See application file for complete search history.

(56) References Cited

U.S. PATENT DOCUMENTS

| | | | |
|---|---|---|---|
| 6,111,795 A | 8/2000 | Takita et al. | |
| 12,027,232 B2 * | 7/2024 | Yang | G11C 8/08 |
| 2018/0166119 A1 * | 6/2018 | Jeong | G11C 5/063 |
| 2020/0411076 A1 * | 12/2020 | Kim | G11C 8/08 |
| 2023/0030836 A1 * | 2/2023 | Yang | G11C 8/08 |

FOREIGN PATENT DOCUMENTS

| | | |
|---|---|---|
| CN | 102044567 A | 5/2011 |
| CN | 112216318 A | 1/2021 |

OTHER PUBLICATIONS

Liu Ruiqiang et al.,"Large size MOS layout", Integrated Circuit Layout Design, China, Mar. 31, 2011, p. 127-128 (machine translation).

* cited by examiner

*Primary Examiner* — Hien N Nguyen
(74) *Attorney, Agent, or Firm* — Kilpatrick Townsend & Stockton LLP (57) ABSTRACT

Embodiments relate to the field of semiconductors and provide a wordline driver circuit and a memory. The wordline driver circuit may at least include a plurality of wordline drivers. Each of the plurality of wordline drivers includes a corresponding PMOS transistor and an NMOS transistor, the plurality of PMOS transistors included in the plurality of wordline drivers are arranged side by side, and the plurality of NMOS transistors included in the plurality of wordline drivers are arranged side by side. In an arrangement direction of the plurality of PMOS transistors, the plurality of PMOS transistors are positioned on the same sides of the plurality of NMOS transistors.

17 Claims, 8 Drawing Sheets

WORDLINE DRIVER CIRCUIT AND MEMORY

CROSS-REFERENCE TO RELATED APPLICATION

This application is a continuation of PCT/CN2021/117277, filed on Sep. 8, 2021, which claims priority to Chinese Patent Application No. 202110864906.8 titled "WORDLINE DRIVER CIRCUIT AND MEMORY" and filed on Jul. 29, 2021, the entire contents of which are incorporated herein by reference.

TECHNICAL FIELD

Embodiments of the present disclosure relate to a wordline driver circuit and a memory.

BACKGROUND

Various circuits in a memory need to use various signals, and signal drivers configured to apply the signals to signal lines are universally used. A wordline driver is configured to apply voltages to wordlines in a memory cell array, and the wordlines can extend from a sub wordline driver (SWD) and pass through the memory cell array. The SWD can selectively activate corresponding wordlines in response to receiving row addresses corresponding to the wordlines by a memory device, such that each memory cell connected to the activated wordlines can output or input data.

SUMMARY

According to some embodiments of the present disclosure, the embodiments of the present disclosure provide a wordline driver circuit, including a plurality of wordline drivers. Each of the plurality of wordline drivers comprises a corresponding P-channel metal oxide semiconductor (PMOS) transistor and an N-channel metal oxide semiconductor (NMOS) transistor. The plurality of PMOS transistors comprised in the plurality of wordline drivers are arranged side by side, and the plurality of NMOS transistors comprised in the plurality of wordline drivers are arranged side by side. In an arrangement direction of the plurality of PMOS transistors, the plurality of PMOS transistors are positioned on the same sides of the plurality of NMOS transistors.

According to some embodiments of the present disclosure, the embodiments of the present disclosure also provide a memory including the above-mentioned wordline driver circuit.

BRIEF DESCRIPTION OF THE DRAWINGS

Exemplary descriptions of one or more embodiments are made by means of pictures in corresponding drawings, and these exemplary descriptions do not constitute a limitation on the embodiments. Unless otherwise stated, the pictures in the drawings do not constitute a scale limitation.

DETAILED DESCRIPTION

The embodiments of the present disclosure will be described in detail below in conjunction with the accompanying drawings. However, a person of ordinary skill in the art may understand that in each embodiment of the present disclosure, many technical details are put forward such that a reader may better understand the present disclosure. However, the technical solutions requested to be protected by the present disclosure may also be implemented even without these technical details or various variations and modifications based on the following embodiments.

Figure 1:
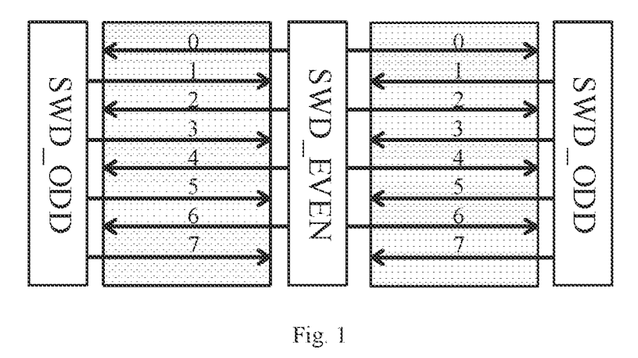
FIG. 1 is a schematic structural diagram of a memory according to an embodiment of the present disclosure.
Figure 2:
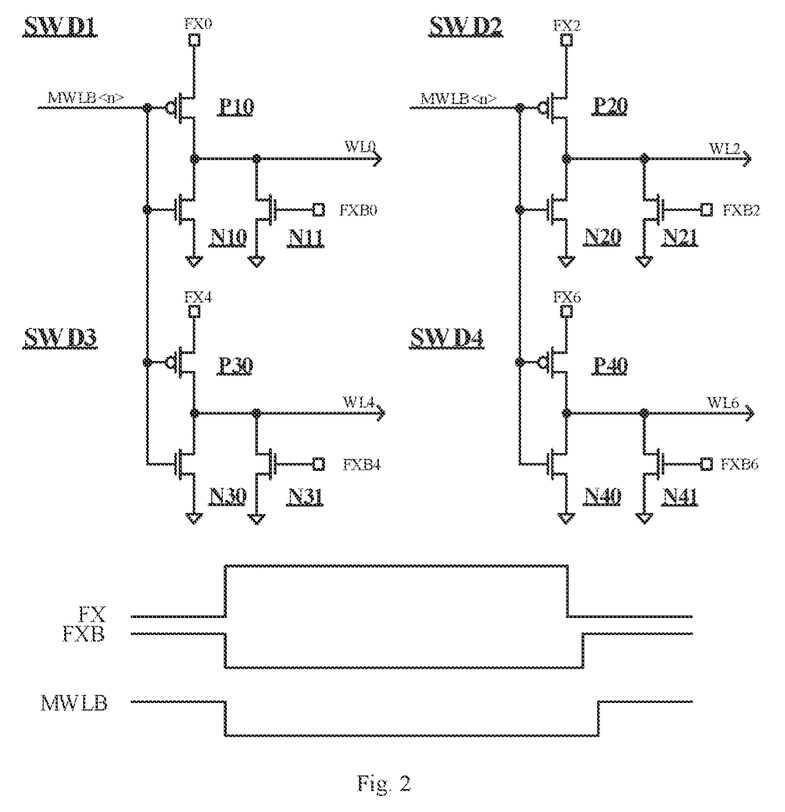
FIG. 2 is a schematic structural diagram of a wordline driver circuit according to an embodiment of the present disclosure.

FIG. 1 is a schematic structural diagram of a memory according to an embodiment of the present disclosure; FIG. 2 is a schematic structural diagram of a wordline driver circuit according to an embodiment of the present disclosure; and FIGS. 3 to 9 are schematic diagrams of a layout structure of the wordline driver circuit according to the embodiments of the present disclosure.

The wordline driver circuit includes a plurality of wordline drivers, wherein each of the plurality of wordline drivers comprises a corresponding P-channel metal oxide semiconductor (PMOS) transistor and an N-channel metal oxide semiconductor (NMOS) transistor. The plurality of PMOS transistors comprised in the plurality of wordline drivers are arranged side by side, and the plurality of NMOS transistors comprised in the plurality of wordline drivers are arranged side by side. In an arrangement direction of the plurality of PMOS transistors, the plurality of PMOS transistors are positioned on the same sides of the plurality of NMOS transistors.

The embodiments of the present disclosure will be described in more detail below in conjunction with the accompanying drawings.

Referring to FIG. 1, according to different wordlines connected, the wordline drivers may be classified into odd wordline drivers SWD_ODD and even wordline drivers SWD_EVEN. The odd wordline drivers SWD_ODD are configured to connect odd wordlines (such as WL1, WL3, WL5, and WL7), and the even wordline drivers SWD_EVEN are configured to connect even wordlines (such as WL0, WL2, WL4, and WL6). In a memory device, the odd wordline drivers SWD_ODD and the even wordline drivers SWD_EVEN are generally arranged at intervals, and the odd wordlines and the even wordlines are generally arranged at intervals.

Referring to FIG. 1 and FIG. 2, a description is made by taking an example where each wordline driver circuit comprises four wordline drivers. As can be seen from the figures, different wordline drivers in the same wordline driver circuit are of the same type. That is, the different wordline drivers are all odd wordline drivers or even wordline drivers. Each of the wordline drivers may include one PMOS transistor and two NMOS transistors, which are respectively denoted as a first PMOS transistor, a first NMOS transistor, and a second NMOS transistor. A gate of the first PMOS transistor and a gate of the first NMOS transistor are configured to receive a first control signal MWLB (for example, MWLB<n>). A source of the first PMOS transistor is configured to receive a second control signal FX (for example, FX0, FX2, FX4, and FX6). A drain of the first PMOS transistor, a drain of the first NMOS transistor, and a drain of the second NMOS transistor are configured to connect the corresponding wordlines (such as WL0, WL2, WL4, and WL6). A source of the first NMOS transistor and a source of the second NMOS transistor are grounded. A gate of the second NMOS transistor is configured to receive a second complementary control signal FXB (for example, FXB0, FXB2, FXB4, and FXB6). In some embodiments, each of the wordline drivers only includes one PMOS transistor and one NMOS transistor.

A moment when the second control signal FX transitions to a high level is the same as a moment when the second control complementary signal FXB transitions to a low level and a moment when the first control signal MWLB transitions to a low level. A moment when the second control complementary signal FXB transitions to a high level is later than a moment when the second control signal FX transitions to a low level, and a moment when the first control signal MWLB transitions to a high level is later than the moment when the second control complementary signal FXB transitions to the high level.

Exemplarily, the wordline driver circuit includes a first wordline driver SWD1, a second wordline driver SWD2, a third wordline driver SWD3, and a fourth wordline driver SWD4. The first wordline driver SWD1 includes a PMOS transistor P10 and two NMOS transistors N10 and N11, the second wordline driver SWD2 includes a PMOS transistor P20 and two NMOS transistors N20 and N21, the third wordline driver SWD3 includes a PMOS transistor P30 and two NMOS transistors N30 and N31, and the fourth wordline driver SWD4 includes a PMOS transistor P40 and two NMOS transistors N40 and N41. P10, P20, P30, and P40 are the first PMOS transistors, N10, N20, N30, and N40 are the first NMOS transistors, and N11, N21, N31, and N41 are the second NMOS transistors.

In some embodiments, each PMOS transistor comprises at least two sub PMOS transistors. In some other embodiments, each NMOS transistor comprises at least two sub NMOS transistors. In yet other embodiments, each PMOS transistor comprises at least two sub PMOS transistors, and each NMOS transistor is constituted by at least two sub NMOS transistors. Exemplarily, the first PMOS transistor comprises a No. 01 PMOS transistor and a No. 02 PMOS transistor, the first NMOS transistor comprises a No. 01 NMOS transistor and a No. 02 NMOS transistor, and the second NMOS transistor comprises a No. 11 NMOS transistor and a No. 12 NMOS transistor. It is to be noted that in the embodiments of the present disclosure, the No. 01 PMOS transistor and the No. 02 PMOS transistor are PMOS transistors with exactly the same physical characteristics, and differences between the No. 01 PMOS transistor and the No. 02 PMOS transistor lie only in their different locations and different connection relationships with other components. Similarly, the second NMOS transistor, the No. 12 NMOS transistor, the No. 01 NMOS transistor and the No. 02 NMOS transistor are NMOS transistors with exactly the same physical characteristics, and the differences lie only in their different locations and different connection relationships with other components. Jointly constituting a PMOS or NMOS transistor by two sub MOS transistors is advantageous to adjust arrangement of layout.

In addition, for the sake of brevity of illustration, FIGS. 3-9 do not mark each transistor or sub transistor. Those skilled in the art may determine, according to the signals received by the gates, the sources and the drains of different transistors in FIG. 2, which transistors or which sub transistors are represented by the transistors in different locations in FIGS. 3-9.

Figure 3:
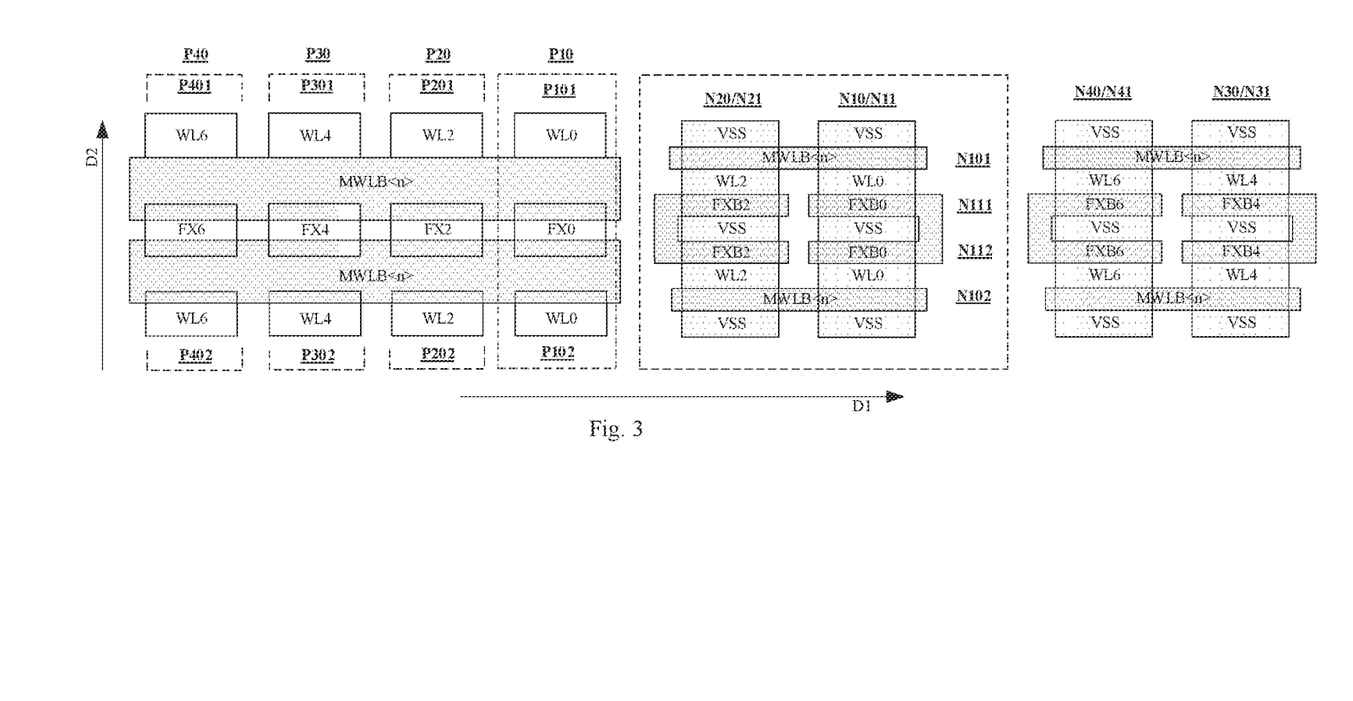
FIGS. 3 to 9 are schematic diagrams of a layout structure of the wordline driver circuit according to embodiments of the present disclosure.

In some embodiments, referring to FIGS. 3, P10, P20, P30 and P40 are arranged side by side along a first direction D1. In the first direction D1, N10/N11 in the first wordline driver, N20/N21 in the second wordline driver, N30/N31 in the third wordline driver, and N40/N41 in the fourth wordline driver are positioned on the same side of the plurality of PMOS transistors.

In some embodiments, two sub PMOS transistors share the same source. Taking the first wordline driver as an example, the PMOS transistor P10 in the first wordline driver comprises two sub PMOS transistors P101 and P102. P101 and P102 share the same active region and are configured to receive the first control signal FX, i.e., FX0.

In some embodiments, the arrangement direction (i.e., the first direction D1) of the plurality of PMOS transistors is perpendicular to a channel length direction (i.e., a second direction D2) of the plurality of PMOS transistors. The arrangement direction of the two sub PMOS transistors is parallel to the channel length direction of the PMOS transistors and is perpendicular to the first direction D1. Continuedly taking the first embodiment as an example, the arrangement direction of P101 and P102 is parallel to the channel length direction and is perpendicular to the first direction D1.

In some embodiments, each PMOS transistor includes a first sub PMOS transistor and a second sub PMOS transistor. The first sub PMOS transistors corresponding to different PMOS transistors share the same gate, and the second sub PMOS transistors corresponding to different PMOS transistors share the same gate. As shown in FIG. 3, the PMOS transistor P20 includes P201 and P202, the PMOS transistor P30 includes P301 and P302, and the PMOS transistor P40 includes P401 and P402. P101, P201, P301, and P401 are arranged side by side along the first direction D1 and share the same gate. P102, P202, P302, and P402 are arranged side by side along the first direction D1 and share another gate.

In some embodiments, the No. 11 NMOS transistor and the No. 12 NMOS transistor are positioned between the No. 01 NMOS transistor and the No. 02 NMOS transistor. Referring to FIG. 3, an internal arrangement mode of the NMOS transistors of different wordline drivers is the same. Taking the first wordline driver as an example, the second NMOS transistor N11 in the first wordline driver comprises the No. 11 NMOS transistor N111 and the No. 12 NMOS transistor. The first NMOS transistor N10 comprises the No. 01 NMOS transistor N101 and the No. 02 NMOS transistor N102, and N111 and N112 are positioned between N101 and N102.

In some embodiments, the arrangement direction of the No. 11 NMOS transistor and the No. 12 NMOS transistor is parallel to the arrangement direction of the No. 01 NMOS transistor and the No. 02 NMOS transistor. Similarly, taking the first wordline driver as an example, the arrangement direction of N111 and N112 is parallel to the arrangement direction of N101 and N102.

In some embodiments, the channel length directions of different transistors are the same as those of their sub transistors, which is beneficial to achieve a unique preset pitch between the PMOS transistors and the NMOS transistors in the same wordline driver, such that the wordline driver has more stable and balanced electrical properties. Taking the first wordline driver as an example, in the first direction D1, a pitch between P101 and N101 is equal to a pitch between P102 and N102. In the first direction D1, a horizontal location of the gate of P101 at least partially overlaps with a horizontal location of the gate of N101, and the pitch between P101 and N101 is the pitch between the gate of P101 and the gate of N101. A pitch between P102 and N102 is described in a similar way, and thus the related descriptions are omitted herein.

Correspondingly, in the first direction D1, a pitch between P101 and N101 is equal to a pitch between P102 and N102. In the first direction D1, a horizontal location of the gate of P101 at least partially overlaps with a horizontal location of the gate of N111, and the pitch between P101 and N111 is the pitch between the gate of P101 and the gate of N111. A pitch between P102 and N112 is described in a similar way, and thus the related descriptions are omitted herein.

In some embodiments, the No. 01 NMOS transistor and the No. 11 NMOS transistor share the same drain, the No. 11 NMOS transistor and the No. 12 NMOS transistor share the same source, and the No. 12 NMOS transistor and the No. 02 NMOS transistor share the same drain. Different transistors share the same source or drain, which is beneficial to reduce an overall size of the wordline driver, thereby implementing miniaturization and micromation of the wordline driver circuit and the memory. Taking the first wordline driver as an example, N101 and N111 share the same active region, which is connected to the zeroth wordline WL0 through a contact hole. N111 and N112 share the same active region, which is grounded or connected to a low-level signal. N112 and N102 share the same active region, which is also connected to the zeroth wordline WL0 through a contact hole.

The No. 11 NMOS transistor and the No. 12 NMOS transistor share the same gate. Different transistors share the same gate, which is advantageous to reduce difficulty of fabricating the gate and to ensure electrical conductivity of the gate. In some embodiments, it is advantageous to reduce complexity of a patterned opening of a mask, avoid occurrence of etching defects caused by complicated patterns, and ensure effective formation of the gate. Taking an embodiment of the first wordline as an example, N111 and N112 share the same gate. That is, the gate of N111 and the gate of N112 are different parts of the same conductive layer, and another part configured to communicate the gate of N111 with the gate of N112 is positioned on an isolation structure. The isolation structure is configured to isolate adjacent active regions, and the wordline may be made from doped polysilicon or metal materials such as tungsten and molybdenum.

Figure 4:
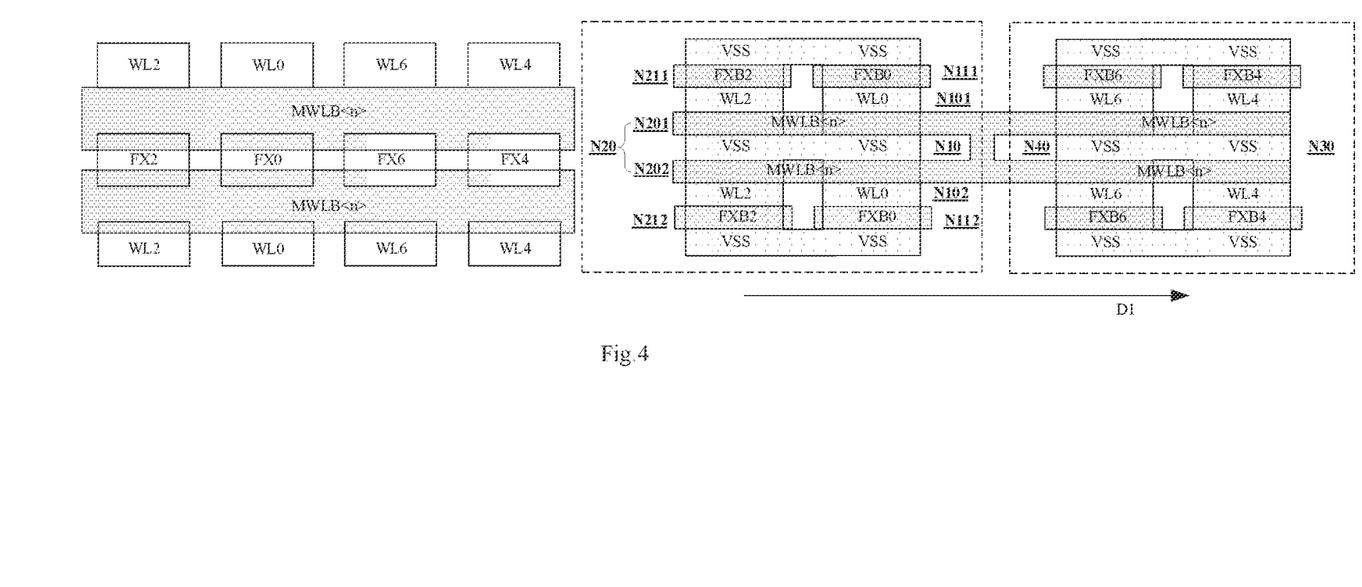

In some embodiments, the No. 01 NMOS transistor and the No. 02 NMOS transistor are positioned between the No. 11 NMOS transistor and the No. 12 NMOS transistor, wherein the No. 01 NMOS transistor and the No. 02 NMOS transistor may share the same gate. Referring to FIG. 4, the internal arrangement modes of the NMOS transistors of different wordline drivers are the same. Taking the first wordline driver as an example, N101 and N102 are positioned between N111 and N112, and N101 and N102 share the same gate.

Similar to the previous embodiment, the arrangement direction of the No. 01 NMOS transistor and the No. 02 NMOS transistor positioned in a middle location is parallel to the arrangement direction of the No. 11 NMOS transistor and the No. 12 NMOS transistor positioned on two sides. Corresponding to FIG. 4. The arrangement direction of N101 and N102 is parallel to the arrangement direction of N111 and N112.

Correspondingly, the No. 11 NMOS transistor and the No. 01 NMOS transistor share the same drain, the No. 01 NMOS transistor and the No. 02 NMOS transistor share the same source, and the No. 02 NMOS transistor and the No. 12 NMOS transistor share the same drain. Corresponding to FIGS. 4, N111 and N101 share the same active region, and the active region is connected to the zeroth wordline WL0 through the contact hole. N101 and N102 share the same active region, and the active region is grounded or connected to a low-level signal. N102 and N112 share the same active region, and the active region is also connected to the zeroth wordline WL0 through the contact hole.

In some embodiments, referring to FIG. 4, the wordline driver includes a first wordline driver and a second wordline driver. The NMOS transistor N10 in the first wordline driver and the NMOS transistor N20 in the second wordline driver share the same source and the same gate. The NMOS transistor N10 comprises N101 and N102, the NMOS transistor N20 comprises N201 and N202, wherein N201, N202, N101 and N102 share the same continuous active region and the same continuous conductive layer. It is to be understood that the gates of different transistors are different parts of the same conductive layer, and other parts of the conductive layer configured to connect the gates of different transistors are positioned on the isolation structure.

Correspondingly, the second NMOS transistor included in the first wordline driver shares the same source with the second NMOS transistor included in the second wordline driver. The second NMOS transistor N11 included in the first wordline driver comprises N111 and N112, and the second NMOS transistor N21 included in the second wordline driver comprises N211 and N212, wherein N111 and N211 share the same source, and N112 and N212 share the same source.

It is to be understood that there are various combinations between different wordline drivers. In the embodiments of the present disclosure, by taking an example where the first wordline driver and the second wordline driver are adjacent to each other, a connection relationship between the NMOS transistors of the adjacent wordline drivers in the wordline driver circuit is described based on this example. It is to be understood that in the embodiment as shown in FIG. 4, the connection relationship between the NMOS transistors of the first wordline driver and the NMOS transistors of the second wordline driver is also applicable to the NMOS transistors of the third wordline driver and the NMOS transistors of the fourth wordline driver. Similarly, in other embodiments, if the first wordline driver and the third wordline driver are adjacent to each other, the above connection relationship is also applicable to the NMOS transistors of the first wordline driver and the NMOS transistors of the third wordline driver. In the following, description is made still by taking the first wordline driver and the second wordline driver as examples, but the application situation is omitted.

In some embodiments, the wordline driver also includes a third wordline driver and a fourth wordline driver. The NMOS transistor N10 of the first wordline driver, the NMOS transistor N20 of the second wordline driver, the NMOS transistor N30 of the third wordline driver and the NMOS transistor N40 of the fourth wordline driver share the same gate.

In some embodiments, a pitch between the PMOS transistor and the NMOS transistor in the wordline driver is denoted as a preset pitch, and the preset pitches between different wordline drivers are the same. Referring to FIG. 4, in the first direction D1, the PMOS transistor of the second wordline driver, the PMOS transistor of the first wordline driver, the PMOS transistor of the fourth wordline driver, and the PMOS transistor of the third wordline driver are arranged in sequence. Furthermore, the NMOS transistors of the second wordline driver, the NMOS transistors of the first wordline driver, the NMOS transistors of the fourth wordline driver, and the NMOS transistors of the third wordline driver are arranged in sequence. The pitch between P10 and N10 is equal to the pitch between P10 and N11, the pitch between P20 and N20 is equal to the pitch between P20 and N21, the pitch between P30 and N30 is equal to the pitch between P30 and N31, and the pitch between P40 and N40 is equal to the pitch between P40 and N41. Further, a first pitch between P10 and N10 is equal to a second pitch between P20 and N20, a third pitch between P30 and N30, and a fourth pitch between P40 and N40. Different preset pitches are set to be equal, which is advantageous to ensure different wordline drivers to have the same or similar properties, such that different wordline drivers apply voltages to corresponding wordlines at similar moments, thereby ensuring stability of internal timing of the memory.

In some embodiments, the arrangement direction of the No. 11 NMOS transistor and the No. 12 NMOS transistor is parallel to the arrangement direction of the No. 01 NMOS transistor and the No. 02 NMOS transistor. The No. 01 NMOS transistor and the No. 02 NMOS transistor share the same gate, and/or the No. 11 NMOS transistor and the No. 12 NMOS transistor share the same gate.

Figure 5:
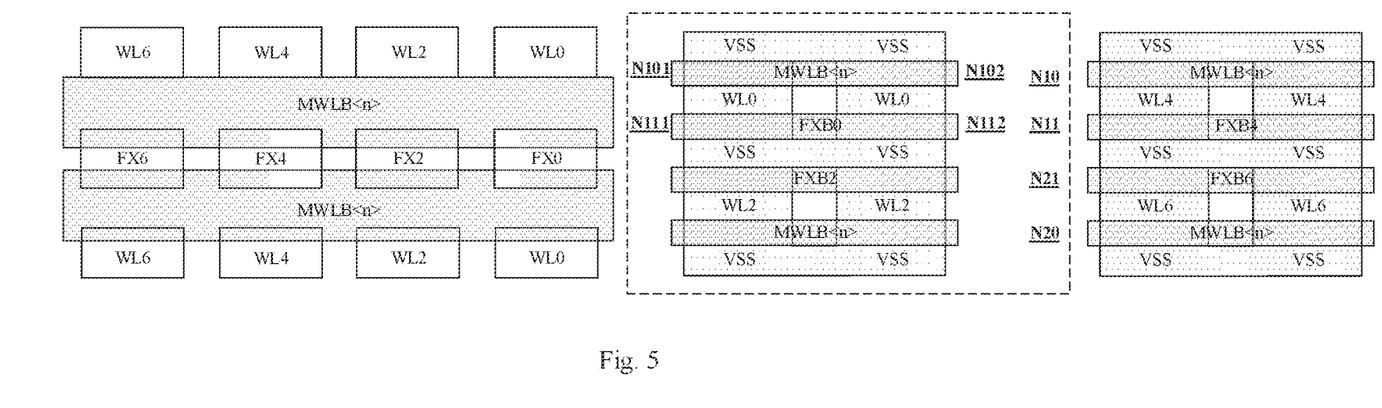

In some embodiments, referring to FIG. 5, the arrangement direction of N111 and N112 is parallel to the arrangement direction of N101 and N102. In addition, the second NMOS transistor included in the first wordline driver and the second NMOS transistor included in the second wordline driver are positioned between the first NMOS transistor included in the first wordline driver and the first NMOS transistor included in the second wordline driver, that is, N11 and N21 are positioned between N10 and N20.

Figure 6:
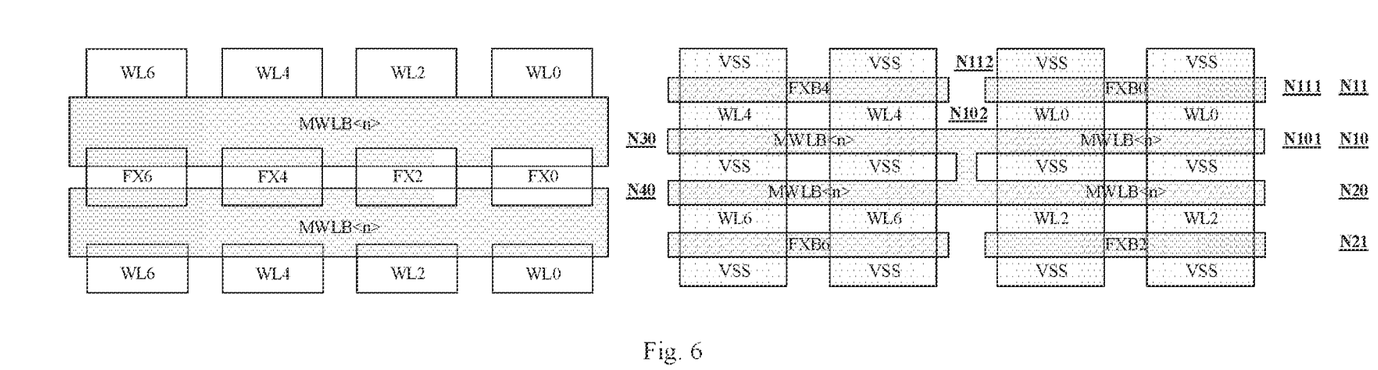

In some other embodiments, referring to FIG. 6, the arrangement direction of N111 and N112 is parallel to the arrangement direction of N101 and N102. In addition, the first NMOS transistor included in the first wordline driver and the first NMOS transistor included in the second wordline driver are positioned between the second NMOS transistor included in the first wordline driver and the second NMOS transistor included in the second wordline driver, that is, N10 and N20 are positioned between N11 and N21. In addition, N10, N20, N30, and N40 share the same gate.

Figure 7:
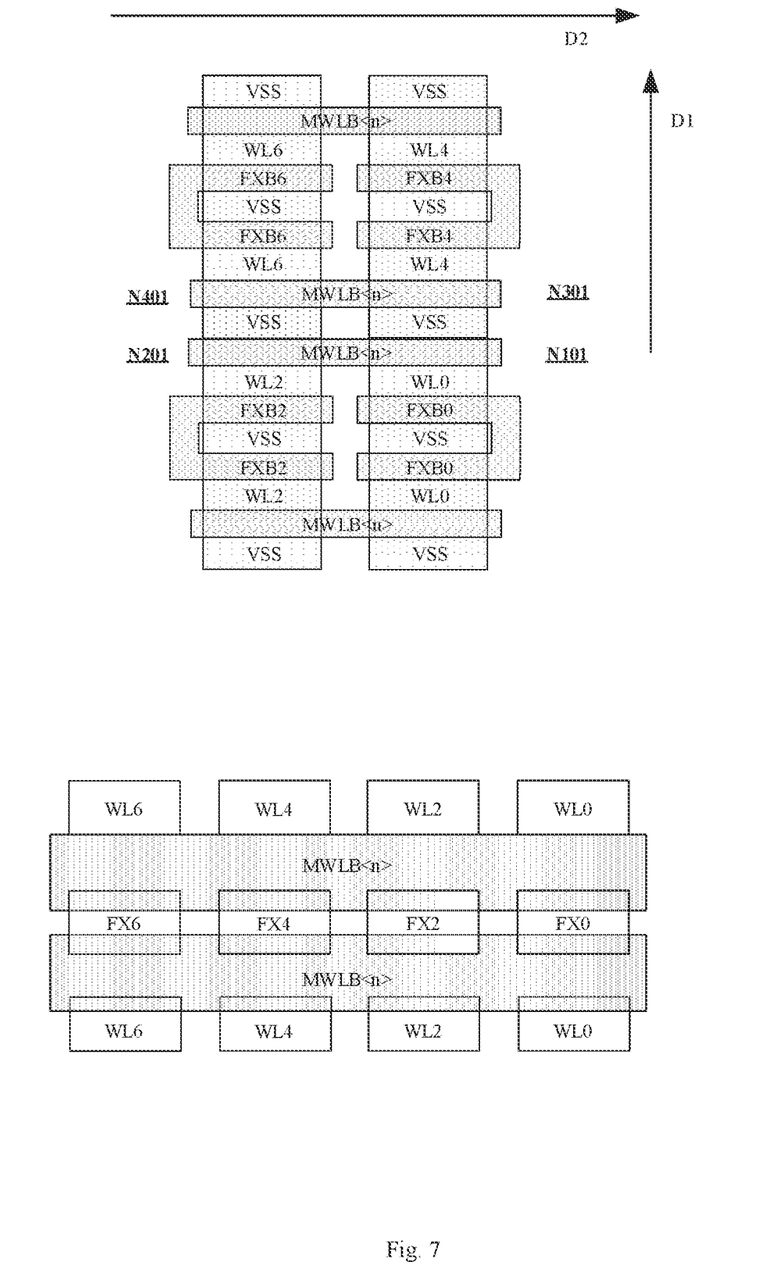
Figure 8:
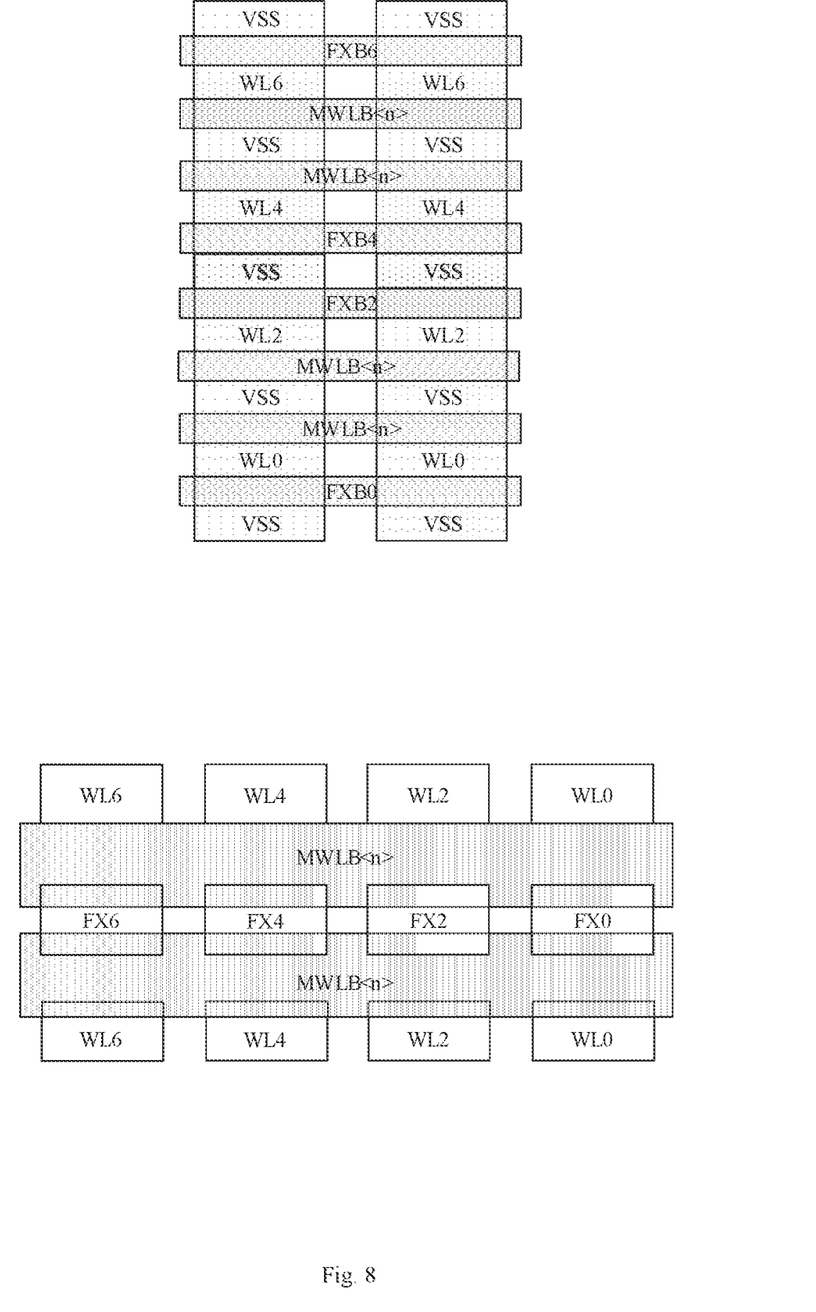
Figure 9:
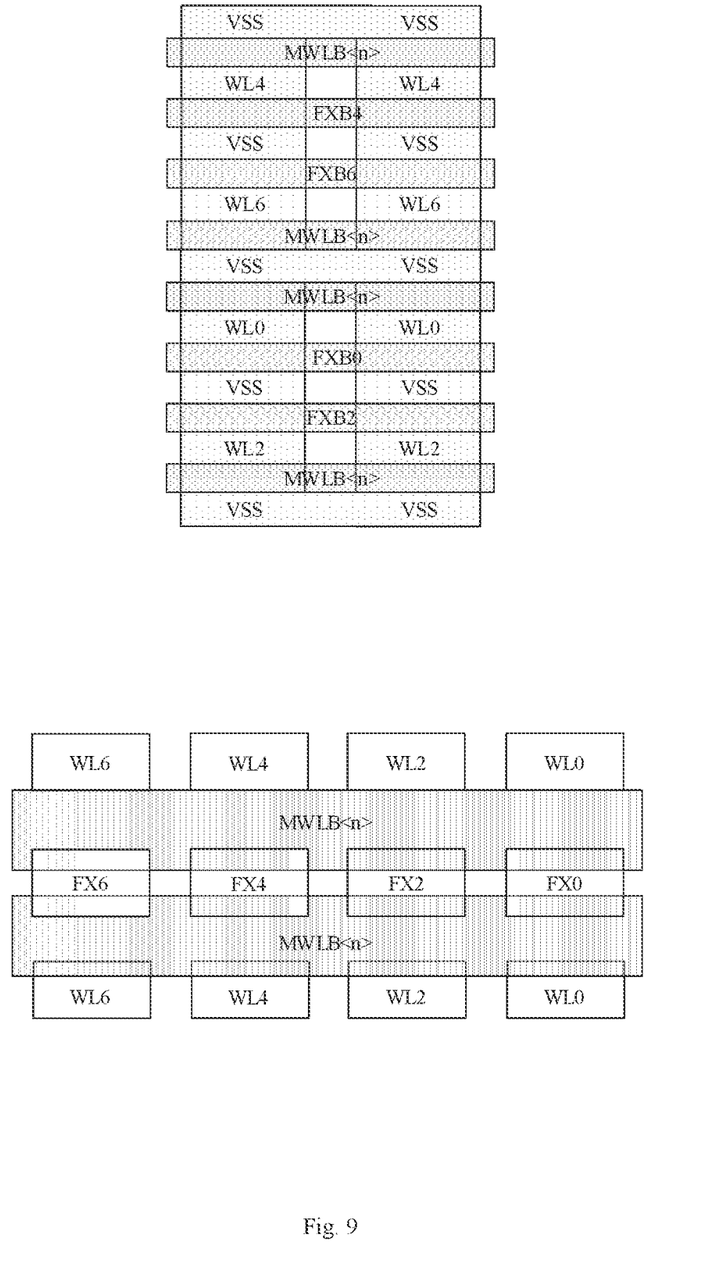

In some embodiments, referring to FIGS. 3 to 6, the channel length direction of the NMOS transistor in the wordline driver is parallel to the channel length direction of the PMOS transistor, that is, the channel length direction of the PMOS transistor is the same as the channel length direction of the NMOS transistor. In some other embodiments, referring to FIGS. 7 to 9, the channel length direction of the NMOS transistor in the wordline driver is perpendicular to the channel length direction of the PMOS transistor. Difference between the embodiment as shown in FIG. 7 and the embodiment as shown in FIG. 3 lies in that the channel length direction of the NMOS transistor in the wordline driver circuit is adjusted as a whole, N301 and N101 are set to share the same source, and N401 and N201 are set to share the same source. Correspondingly, the embodiment as shown in FIG. 8, the embodiment as shown in FIG. 6, and the embodiments shown in FIG. 9 and FIG. 5 are mainly adjusted likewise.

An extension direction of the wordline connected to the wordline driver is generally parallel to an extension direction of the gate of the PMOS transistor in the wordline driver, so setting the channel length direction of the NMOS transistor perpendicular to the channel length direction of the PMOS transistor is beneficial to avoid more NMOS transistors being arranged side by side in the second direction D2 perpendicular to the first direction D1, to reserve more space for the extension of the drain of the NMOS transistor, such that the drain of the NMOS transistor has a larger width, which is beneficial for the wordline extending from the drain of the PMOS transistor to be directly connected to the drain of the corresponding NMOS transistor without bending. That is, the wordline is ensured to be straight, such that resistance of the wordline and RC delay caused by the resistance are reduced, and it is ensured that the wordline driver circuit has good electrical properties.

In this embodiment, in the arrangement direction of each of the plurality of PMOS transistors, the plurality of PMOS transistors are positioned on the same side of the plurality of NMOS transistors. In this way, it is beneficial to avoid the plurality of PMOS transistors and the plurality of NMOS transistors being arranged side by side in the direction perpendicular to the above arrangement direction, which is advantageous to extend a channel length or gate width of the plurality of PMOS transistors and the plurality of NMOS transistors and improve the electrical properties of the wordline driver circuit. Furthermore, controlling the plurality of PMOS transistors to be positioned on the same side of the plurality of NMOS transistors helps to ensure a relative positional relationship between the PMOS transistors and the NMOS transistors in different wordline drivers to be the same, and different wordlines connected to different wordline drivers extend in the same direction, thereby simplifying the layout complexity of the wordline driver circuit, and reducing manufacturing costs. In addition, the plurality of PMOS transistors are positioned on the same side of the plurality of NMOS transistors, such that in layout design, it is only necessary to control an arrangement pitch of the plurality of PMOS transistors to be equal to an arrangement pitch of the plurality of NMOS transistors, without considering a pitch between the side-by-side NMOS transistors and the side-by-side PMOS transistors, which is beneficial to realize the equal pitch between the PMOS transistors and the NMOS transistors in different wordline drivers, thereby ensuring that different wordline drivers have the same or similar driving capabilities, and ensuring that the wordline driver circuit has good stability.

An embodiment of the present disclosure also provides a memory, which includes the wordline driver circuit described in any one of the above embodiments. In the context of increasingly miniaturized integrated circuits, the wordline driver circuit with the above structure has good overall characteristics because its transistors and wordlines have good electrical properties, such that overall properties of the memory can be improved.

Those of ordinary skill in the art can understand that the above-mentioned embodiments are some embodiments for realizing the present disclosure, but in practical applications, various changes can be made to them in form and details without departing from the spirit and scope of the present disclosure. Any person skilled in the art can make their own changes and modifications without departing from the spirit and scope of the present disclosure. Therefore, the protection scope of the present disclosure shall be subject to the scope defined by the claims.

What is claimed is:

1. A wordline driver circuit, comprising:
 a plurality of wordline drivers, each of the plurality of wordline drivers comprising a corresponding P-channel metal oxide semiconductor (PMOS) transistor and an N-channel metal oxide semiconductor (NMOS) transistor, a plurality of PMOS transistors comprised in the plurality of wordline drivers being arranged side by side, a plurality of NMOS transistors comprised in the plurality of wordline drivers being arranged side by side, in an arrangement direction of the plurality of PMOS transistors, the plurality of PMOS transistors being positioned on same sides of the plurality of NMOS transistors.

2. The wordline driver circuit according to claim 1, wherein each of the plurality of PMOS transistors comprises at least two sub PMOS transistors.

3. The wordline driver circuit according to claim 2, wherein the two sub PMOS transistors share a same source.

4. The wordline driver circuit according to claim 2, wherein an arrangement direction of the two sub PMOS transistors is parallel to a channel length direction of each of the plurality of PMOS transistors.

5. The wordline driver circuit according to claim 2, wherein each of the plurality of PMOS transistors comprises a first sub PMOS transistor and a second sub PMOS transistor, the first sub PMOS transistors corresponding to different of the plurality of PMOS transistors sharing a same gate, and the second sub PMOS transistors corresponding to different of the plurality of PMOS transistors sharing the same gate.

6. The wordline driver circuit according to claim 1, wherein the arrangement direction of the plurality of PMOS transistors is perpendicular to a channel length direction of each of the plurality of PMOS transistors.

7. The wordline driver circuit according to claim 1, wherein each of the plurality of NMOS transistors comprises at least two sub NMOS transistors.

8. The wordline driver circuit according to claim 1, wherein each of the plurality of wordline drivers comprises a first PMOS transistor, a first NMOS transistor, and a second NMOS transistor, a gate of the first PMOS transistor being configured to receive a first control signal, a source of the first PMOS transistor being configured to receive a second control signal, and a drain of the first PMOS transistor being connected to a wordline, a gate of the first NMOS transistor being configured to receive the first control signal, a source of the first NMOS transistor being grounded, and a drain of the first NMOS transistor being connected to the wordline, a gate of the second NMOS transistor being configured to receive a second control complementary signal, a source of the second NMOS transistor being grounded, and a drain of the second NMOS transistor being connected to the wordline, the first NMOS transistor comprising a No. 01 NMOS transistor and a No. 02 NMOS transistor, and the second NMOS transistor comprising a No. 11 NMOS transistor and a No. 12 NMOS transistor.

9. The wordline driver circuit according to claim 8, wherein the No. 11 NMOS transistor and the No. 12 NMOS transistor are positioned between the No. 01 NMOS transistor and the No. 02 NMOS transistor.

10. The wordline driver circuit according to claim 8, wherein the No. 01 NMOS transistor and the No. 02 NMOS transistor are positioned between the No. 11 NMOS transistor and the No. 12 NMOS transistor.

11. The wordline driver circuit according to claim 10, wherein each of the plurality of wordline drivers comprises a first wordline driver, a second wordline driver, a third wordline driver, and a fourth wordline driver, the first NMOS transistor of the first wordline driver, the first NMOS transistor of the second wordline driver, the first NMOS transistor of the third wordline driver, and the first NMOS transistor of the fourth wordline driver sharing the same gate.

12. The wordline driver circuit according to claim 8, wherein the arrangement direction of the No. 11 NMOS transistor and the No. 12 NMOS transistor is parallel to that of the No. 01 NMOS transistor and the No. 02 NMOS transistor.

13. The wordline driver circuit according to claim 12, wherein each of the plurality of wordline drivers comprises a first wordline driver and a second wordline driver, the second NMOS transistor comprised in the first wordline driver and the second NMOS transistor comprised in the second wordline driver being positioned between the first NMOS transistor comprised in the first wordline driver and the first NMOS transistor comprised in the second wordline driver.

14. The wordline driver circuit according to claim 12, wherein each of the plurality of wordline drivers comprises a first wordline driver and a second wordline driver, the first NMOS transistor comprised in the first wordline driver and the first NMOS transistor comprised in the second wordline driver being positioned between the second NMOS transistor comprised in the first wordline driver and the second NMOS transistor comprised in the second wordline driver.

15. The wordline driver circuit according to claim 14, wherein each of the plurality of wordline drivers comprises a third wordline driver and a fourth wordline driver, the first NMOS transistor of the first wordline driver, the first NMOS transistor of the second wordline driver, the first NMOS transistor of the third wordline driver, and the first NMOS transistor of the fourth wordline driver sharing the same gate.

16. The wordline driver circuit according to claim 1, wherein a channel extension direction of the NMOS transistor is perpendicular to the channel extension direction of the PMOS transistor.

17. A memory comprising a wordline driver circuit, wherein the wordline driver circuit comprises:
a plurality of wordline drivers, each of the plurality of wordline drivers comprising a corresponding P-channel metal oxide semiconductor (PMOS) transistor and an N-channel metal oxide semiconductor (NMOS) transistor, a plurality of PMOS transistors comprised in the plurality of wordline drivers being arranged side by side, a plurality of NMOS transistors comprised in the plurality of wordline drivers being arranged side by side, in an arrangement direction of the plurality of PMOS transistors, the plurality of PMOS transistors being positioned on same sides of the plurality of NMOS transistors.

* * * * *